United States Patent
Zhang et al.

(10) Patent No.: US 10,157,733 B2
(45) Date of Patent: Dec. 18, 2018

(54) METHODS FOR IGNITING A PLASMA IN A SUBSTRATE PROCESSING CHAMBER

(71) Applicant: APPLIED MATERIALS, INC., Santa Clara, CA (US)

(72) Inventors: Shouyin Zhang, Livermore, CA (US); Fuhong Zhang, San Jose, CA (US); Joung Joo Lee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/409,195

(22) Filed: Jan. 18, 2017

(65) Prior Publication Data

US 2017/0221685 A1   Aug. 3, 2017

Related U.S. Application Data

(60) Provisional application No. 62/288,896, filed on Jan. 29, 2016.

(51) Int. Cl.
| | |
|---|---|
| *C23C 14/35* | (2006.01) |
| *H01J 37/34* | (2006.01) |
| *H01J 37/32* | (2006.01) |

(52) U.S. Cl.
CPC .......... *H01J 37/3447* (2013.01); *C23C 14/35* (2013.01); *H01J 37/3244* (2013.01); *H01J 37/3405* (2013.01); *H01J 37/3444* (2013.01)

(58) Field of Classification Search
CPC ... C23C 14/35; H01J 37/3244; H01J 37/3405; H01J 37/3438; H01J 37/3444; H01J 37/3447

USPC ..................................... 204/192.12, 298.11
See application file for complete search history.

(56) References Cited

U.S. PATENT DOCUMENTS

| | | | |
|---|---|---|---|
| 5,702,573 A | 12/1997 | Biberger et al. | |
| 5,728,276 A * | 3/1998 | Katsuki ................. | C23C 14/34 204/192.12 |
| 6,057,244 A | 5/2000 | Hausmann et al. | |
| 6,149,784 A | 11/2000 | Su et al. | |
| 6,413,383 B1 | 7/2002 | Chiang et al. | |
| 6,692,617 B1 * | 2/2004 | Fu ....................... | C23C 14/3457 204/192.12 |
| 7,422,664 B2 | 9/2008 | Ritchie et al. | |
| 2003/0159782 A1 | 8/2003 | Brcka | |

FOREIGN PATENT DOCUMENTS

| | | |
|---|---|---|
| JP | 2006-156530 A | 6/2006 |
| WO | WO 2011-031566 A1 | 3/2011 |

\* cited by examiner

*Primary Examiner* — Rodney G McDonald
(74) *Attorney, Agent, or Firm* — Moser Taboada; Alan Taboada

(57) ABSTRACT

Embodiments of method for igniting a plasma are provided herein. In some embodiments, a method for igniting a plasma includes: flowing a process gas into a process chamber to increase a pressure within the process chamber to a first pressure; applying a first bias voltage from a collimator power source to a collimator disposed within the process chamber; and applying a second power to a sputtering source disposed in the process chamber above the collimator after the first pressure has been reached and the first bias voltage is applied to ignite the plasma.

19 Claims, 3 Drawing Sheets

METHODS FOR IGNITING A PLASMA IN A SUBSTRATE PROCESSING CHAMBER

CROSS-REFERENCE TO RELATED APPLICATIONS

This application claims benefit of U.S. provisional patent application Ser. No. 62/288,896, filed Jan. 29, 2016, which is herein incorporated by reference in its entirety.

FIELD

Embodiments of the present disclosure generally relate to substrate processing chambers used in semiconductor manufacturing systems.

BACKGROUND

Sputtering, also known as physical vapor deposition (PVD), is a method of forming metallic features in integrated circuits. Sputtering deposits a material layer on a substrate. A source material, such as a target, is bombarded by ions strongly accelerated by an electric field. The bombardment ejects material from the target, and the material then deposits on the substrate. During deposition, ejected particles may travel in varying directions, rather than generally orthogonal to the substrate surface, undesirably resulting in overhanging structures formed on corners of high aspect ratio features in the substrate. Overhang may undesirably result in holes or voids formed within the deposited material, resulting in diminished electrical conductivity of the formed feature. Higher aspect ratio geometries have a higher degree of difficulty to fill without voids.

Controlling the ion fraction or ion density reaching the substrate surface to a desired range may improve the bottom and sidewall coverage during the metal layer deposition process (and reduce the overhang problem). In one example, the particles dislodged from the target may be controlled via a process tool such as a collimator to facilitate providing a more vertical trajectory of particles into the feature. The collimator provides relatively long, straight, and narrow passageways between the target and the substrate to filter out non-vertically travelling particles that impact and stick to the passageways of the collimator.

Attempts have been made to ignite a plasma in the PVD chamber at a low power level (e.g., about 100 W to about 3000 W) using less processing gas and/or lower gas pressures than used during processing of the substrate. However, the inventors have observed that conventional chambers have proven to be unreliable in igniting plasmas under such conditions. Specifically, previous ignition methods have proven to be unreliable, often requiring 10 or more attempts to ignite the plasma (e.g., ignition retries). Since excessive high voltage (e.g., 300V-3000V) or complicated waveforms may be used to breakdown the relatively higher pressure gases (much higher pressure than the high power deposition step), a high number of ignition retries could lead to defects or particle related issues in deposited films. The delay and uncertainty of ignition also may cause issues with the timing of process sequences and/or throughput issues in multi sequential processes on a complicated multi chamber semiconductor tool system. The inventors thus believe that limiting the number of ignition retries, ideally to be less than 2-3 times per wafer process at most, is very advantageous. However, such a retry limit would lead to a process fault using conventional techniques due to the ignition problems with previous ignition methods discussed above.

Thus, the inventors have provided improved methods for igniting a plasma, including igniting a plasma at low power and/or low pressure levels.

SUMMARY

Embodiments of method for igniting a plasma are provided herein. In some embodiments, a method for igniting a plasma includes: flowing a process gas into a process chamber to increase a pressure within the process chamber to a first pressure; applying a first bias voltage from a collimator power source to a collimator disposed within the process chamber; and applying a second power to a sputtering source disposed in the process chamber above the collimator after the first pressure has been reached and the first bias voltage is applied to ignite the plasma.

In some embodiments, a method for igniting a plasma includes: flowing a process gas into a process chamber to increase a pressure within the process chamber to a first pressure of about 0.1 mTorr to about 100 mTorr; applying a first bias voltage of about 15 V and about 150 V from a collimator power source to a collimator disposed within the process chamber; applying a second power to a sputtering source disposed in the process chamber above the collimator after the first pressure has been reached and the first bias voltage is applied to ignite the plasma; and decreasing the pressure within the process chamber after plasma ignition.

In some embodiments, a method for igniting a plasma includes: flowing a process gas into a process chamber to increase a pressure within the process chamber to a first pressure of about 0.1 mTorr to about 100 mTorr; applying a first bias voltage of about 15 V and about 150 V from a collimator power source to a collimator disposed within the process chamber; applying a second power of about 100 W to about 5,000 W to a sputtering source disposed in the process chamber above the collimator after the first pressure has been reached and the first bias voltage is applied to ignite the plasma, wherein the second power provides a voltage of about −300 V and about −2,000 V to the target; and decreasing the pressure within the process chamber after plasma ignition.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of some embodiments may be beneficially incorporated in other embodiments without further recitation.

DETAILED DESCRIPTION

Embodiments method for igniting a plasma in a process chamber are provided herein. The methods advantageously provide for more reliable low power and low pressure plasma ignition. The hardware necessary to perform the inventive method may advantageously be retrofitted to existing process chambers.

The inventors note that, for most physical vapor deposition (PVD) applications, introducing working gases other than the materials to be deposited may be undesirable. In many cases, excluding those gases completely, if possible, is preferable. However, during the start of many metal PVD deposition processes, working gases are still used to establish the initial condition of providing metal neutrals for metal deposition plasmas. Therefore, reducing the working gas pressure before or immediately after the start of the deposition process is very advantageous. Typically, a working gas pressure of about 0.1 millitorr to about 100 millitorr may be used. Although higher working gas pressures typically make plasma ignition easier, such higher pressures are disadvantageous to the PVD deposition process, particularly as integrated circuit features shrink and feature aspect ratios increase.

In addition, the power used to prepare the ignition plasma often creates unwanted metal deposition plasmas due to the immature plasma conditions for the applications. Therefore, using as small an ignition power as possible (as compared to the usually 10 times or more higher deposition power used during the metal deposition processes) is advantageous. Typically, ignition power provided is in the range of 100 W to 3000 W depending upon the application.

Figure 1:
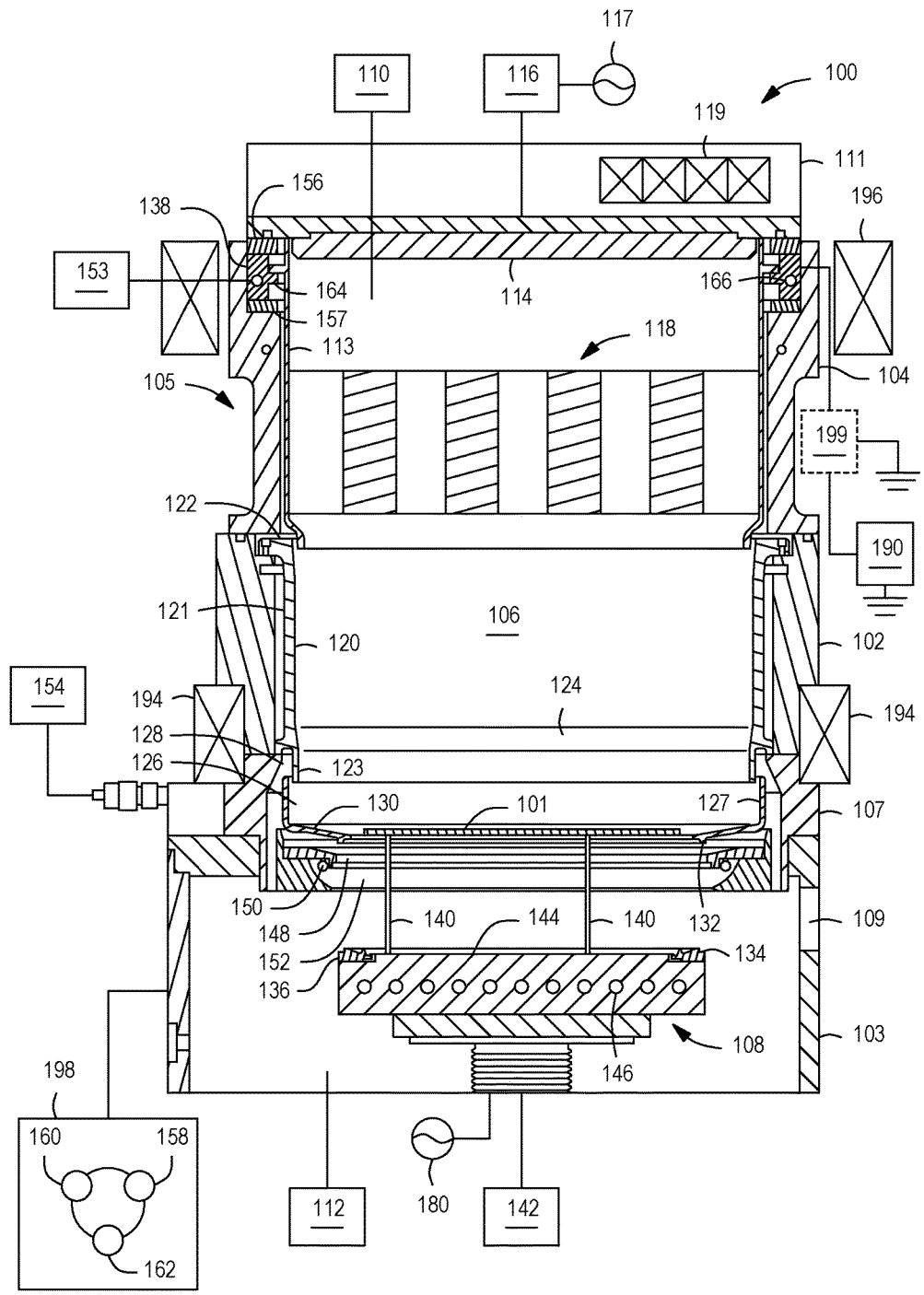
FIG. 1 depicts a schematic cross-sectional view of a process chamber in accordance with the some embodiments of the present disclosure.

Embodiments of the present disclosure are illustratively described herein with respect to a physical vapor deposition (PVD) chamber. However, the inventive method may be used in any process chamber having a collimator or similar structure separating the main plasma chamber volume into two parts between the sputtering target and the substrate. FIG. 1 illustrates a PVD chamber (deposition chamber 100), e.g., a sputter process chamber, suitable for sputter depositing materials and having a collimator 118 disposed therein and supported by a process tool adapter 138 in accordance with embodiments of the present disclosure. In the embodiment illustrated in FIG. 1, the process tool adapter 138 is a cooled process tool adapter. Illustrative examples of suitable PVD chambers that may be adapted to benefit from the disclosure include the ALPS® Plus and SIP ENCORE® PVD processing chambers, both commercially available from Applied Materials, Inc., Santa Clara, of Calif. Other processing chambers available from Applied Materials, Inc. as well as other manufacturers may also be adapted in accordance with the embodiments described herein.

The deposition chamber 100 has an upper sidewall 102, a lower sidewall 103, a ground adapter 104, and a lid assembly 111 defining a body 105 that encloses an interior volume 106 thereof. An adapter plate 107 may be disposed between the upper sidewall 102 and the lower sidewall 103. A substrate support, such as a pedestal 108, is disposed in the interior volume 106 of the deposition chamber 100. A substrate transfer port 109 is formed in the lower sidewall 103 for transferring substrates into and out of the interior volume 106.

In some embodiments, the deposition chamber 100 is a sputtering chamber, also known as a physical vapor deposition (PVD) chamber, capable of depositing, for example, titanium, aluminum oxide, aluminum, aluminum oxynitride, copper, tantalum, tantalum nitride, tantalum oxynitride, titanium oxynitride, tungsten, or tungsten nitride on a substrate, such as the substrate 101.

A gas source 110 is coupled to the deposition chamber 100 to supply process gases into the interior volume 106. In some embodiments, process gases may include inert gases, non-reactive gases, and reactive gases, if necessary. Examples of process gases that may be provided by the gas source 110 include, but not limited to, argon gas (Ar), helium (He), neon gas (Ne), nitrogen gas ($N_2$), oxygen gas ($O_2$), and water ($H_2O$) vapor among others.

A pumping device 112 is coupled to the deposition chamber 100 in communication with the interior volume 106 to control the pressure of the interior volume 106. In some embodiments, during deposition the pressure level of the deposition chamber 100 may be maintained at about 1 Torr or less. In some embodiments, the pressure level of the deposition chamber 100 may be maintained at about 500 mTorr or less during deposition. In some embodiments, the pressure level of the deposition chamber 100 may be maintained at about 1 mTorr and about 300 mTorr during deposition, about 0 mTorr to about 300 mTorr.

The ground adapter 104 may support a sputtering source 114, such as a target. In some embodiments, the sputtering source 114 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In some embodiments, the sputtering source 114 may be fabricated from titanium (Ti) metal, tantalum metal (Ta) or aluminum (Al).

The sputtering source 114 may be coupled to a source assembly 116 comprising a power supply 117 for the sputtering source 114. In some embodiments, the power supply 117 may be an RF power supply. In some embodiments, the power supply 117 may alternatively be a DC power supply. In some embodiments, the power supply 117 may include both DC and RF power sources. A magnetron assembly 119 which includes set of magnets may be coupled adjacent to the sputtering source 114 which enhances efficient sputtering materials from the sputtering source 114 during processing. Examples of the magnetron assembly include an electromagnetic linear magnetron, a serpentine magnetron, a spiral magnetron, a double-digitated magnetron, a rectangularized spiral magnetron, among others.

In some embodiments, a first set of magnets 194 may be disposed between the adapter plate 107 and the upper sidewall 102 to assist generating a magnetic field to guide the metallic ions dislodged from the sputtering source 114. A second set of magnets 196 may be disposed adjacent to the ground adapter 104 to assist generating the magnetic field to guide dislodged materials from the sputtering source 114. The numbers of the magnets disposed around the deposition chamber 100 may be selected to control plasma dissociation and sputtering efficiency.

An RF power source 180 may be coupled to the deposition chamber 100 through the pedestal 108 to provide a bias power between the sputtering source 114 and the pedestal 108. In some embodiments, the RF power source 180 may have a frequency between about 400 Hz and about 60 MHz, such as about 13.56 MHz.

The deposition chamber 100 further includes an upper shield 113 and a lower shield 120. A collimator 118 is positioned in the interior volume 106 between the sputtering source 114 and the pedestal 108. The collimator 118 is coupled to the upper shield 113 using any fixation means. In some embodiments, the collimator 118 may be formed integrally with the upper shield 113. The collimator 118 may be electrically biased to control ion flux to the substrate and neutral angular distribution at the substrate, as well as to increase the deposition rate due to the added DC bias. Electrically biasing the collimator results in reduces ion loss to the collimator to advantageously enable greater ion/neutral ratios at the substrate.

In some embodiments, the collimator 118 may be electrically biased in bipolar mode so as to control the direction of the ions passing through the collimator 118. For example, a controllable direct current (DC) or AC collimator power source 190 may be coupled to the collimator 118 to provide an alternating pulsed positive or negative voltage to the collimator 118 so as to bias the collimator 118. In some embodiments, the collimator power source 190 is a DC power source.

To facilitate applying bias to the collimator 118, the collimator 118 is electrically isolated from grounded chamber components such as the ground adapter 104. For example, in the embodiment depicted in FIG. 1, the collimator 118 is coupled to the upper shield 113, which in turn is coupled to the process tool adapter 138. The process tool adapter 138 may be made from suitable conductive materials compatible with processing conditions in the deposition chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113. In some embodiments, the mounting ring or shelf 164 is a continuous ring about the inner diameter of the process tool adapter 138 to facilitate more uniform thermal contact with the upper shield 113 mounted to the process tool adapter 138.

In some embodiments, a coolant channel 166 may be provided in the process tool adapter 138 to facilitate flowing a coolant through the process tool adapter 138 to remove heat generated during processing. For example, the coolant channel 166 may be coupled to a coolant source 153 to provide a suitable coolant, such as water. The coolant channel 166 advantageously removes heat from the process tool (e.g., collimator 118) that is not readily transferred to other cooled chamber components, such as the ground adapter 104. For example, the insulator rings 156, 157 disposed between the process tool adapter 138 and the ground adapter 104 are typically made from materials with poor thermal conductivity. Thus, the insulator rings 156, 157 reduce the rate of heat transfer from the collimator 118 to the ground adapter 104 and the process tool adapter 138 advantageously maintains or increases the rate of cooling of the collimator 118. In addition to the coolant channel 166 provided in the process tool adapter 138, the ground adapter 104 may also include a coolant channel to further facilitate removing heat generated during processing.

A radially inwardly extending ledge (e.g., the mounting ring, or shelf 164) is provided to support the upper shield 113 within the central opening within the interior volume 106 of the deposition chamber 100. In some embodiments the shelf 164 is disposed in a location proximate the coolant channel 166 to facilitate maximizing the heat transfer from the collimator 118 to the coolant flowing in the coolant channel 166 during use.

In some embodiments, the lower shield 120 may be provided in proximity to the collimator 118 and interior of the ground adapter 104 or the upper sidewall 102. The collimator 118 includes a plurality of apertures to direct gas and/or material flux within the interior volume 106. The collimator 118 may be coupled to the collimator power source via the process tool adapter 138.

The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123. A shield ring 126 may be disposed in the deposition chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

In some embodiments, the shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the pedestal 108. The recess 134 may be a circular groove formed in the edge ring 136. The engagement of the protrusion 132 and the recess 134 centers the shield ring 126 with respect to the longitudinal axis of the pedestal 108. The substrate 101 (shown supported on lift pins 140) is centered relative to the longitudinal axis of the pedestal 108 by coordinated positioning calibration between the pedestal 108 and a robot blade (not shown). Thus, the substrate 101 may be centered within the deposition chamber 100 and the shield ring 126 may be centered radially about the substrate 101 during processing.

In operation, a robot blade (not shown) having the substrate 101 disposed thereon is extended through the substrate transfer port 109. The pedestal 108 may be lowered to allow the substrate 101 to be transferred to the lift pins 140 extending from the pedestal 108. Lifting and lowering of the pedestal 108 and/or the lift pins 140 may be controlled by a drive 142 coupled to the pedestal 108. The substrate 101 may be lowered onto a substrate receiving surface 144 of the pedestal 108. With the substrate 101 positioned on the substrate receiving surface 144 of the pedestal 108, sputter deposition may be performed on the substrate 101. The edge ring 136 may be electrically insulated from the substrate 101 during processing. Therefore, the substrate receiving surface 144 may include a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the pedestal 108.

After sputter deposition, the substrate 101 may be elevated utilizing the lift pins 140 to a position that is spaced away from the pedestal 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. The adapter plate 107 may be coupled to a coolant source 154 to control the temperature of the adapter plate 107 during heating.

After controlling the substrate 101 to a predetermined temperature, the substrate 101 is lowered to a position on the substrate receiving surface 144 of the pedestal 108. The substrate 101 may be rapidly cooled utilizing the thermal control channels 146 in the pedestal 108 via conduction. The temperature of the substrate 101 may be ramped down from the first temperature to a second temperature in a matter of seconds to about a minute. The substrate 101 may be removed from the deposition chamber 100 through the substrate transfer port 109 for further processing. The substrate 101 may be maintained at a predetermined temperature range, such as less than 250 degrees Celsius.

A controller 198 is coupled to the deposition chamber 100. The controller 198 includes a central processing unit (CPU) 160, a memory 158, and support circuits 162. The controller 198 is utilized to control the process sequence, regulating the gas flows from the gas source 110 into the deposition chamber 100 and controlling ion bombardment of the sputtering source 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 198 that controls the deposition chamber 100 such that the processes, including the plasma ignition processes disclosed below, are performed in accordance with embodiments of the present disclosure. The software routines may also be stored and/or executed by a second controller (not shown) that is located remotely from the deposition chamber 100.

During processing, material is sputtered from the sputtering source 114 and deposited on the surface of the substrate 101. The sputtering source 114 and the pedestal 108 are biased relative to each other by the power supply 117 or the RF power source 180 to maintain a plasma formed from the process gases supplied by the gas source 110. The DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the sputtering source 114, causing target material to be dislodged from the sputtering source 114. The dislodged target material and process gases forms a layer on the substrate 101 with desired compositions.

The deposition chamber 100 may optionally include a switch 199 between the upper shield 113 and the collimator power source 190 to selectively couple the upper shield 113 to the collimator power source 190. In other positions of the switch 199, the upper shield 113 may be coupled to ground or may be electrically floating.

Figure 2:
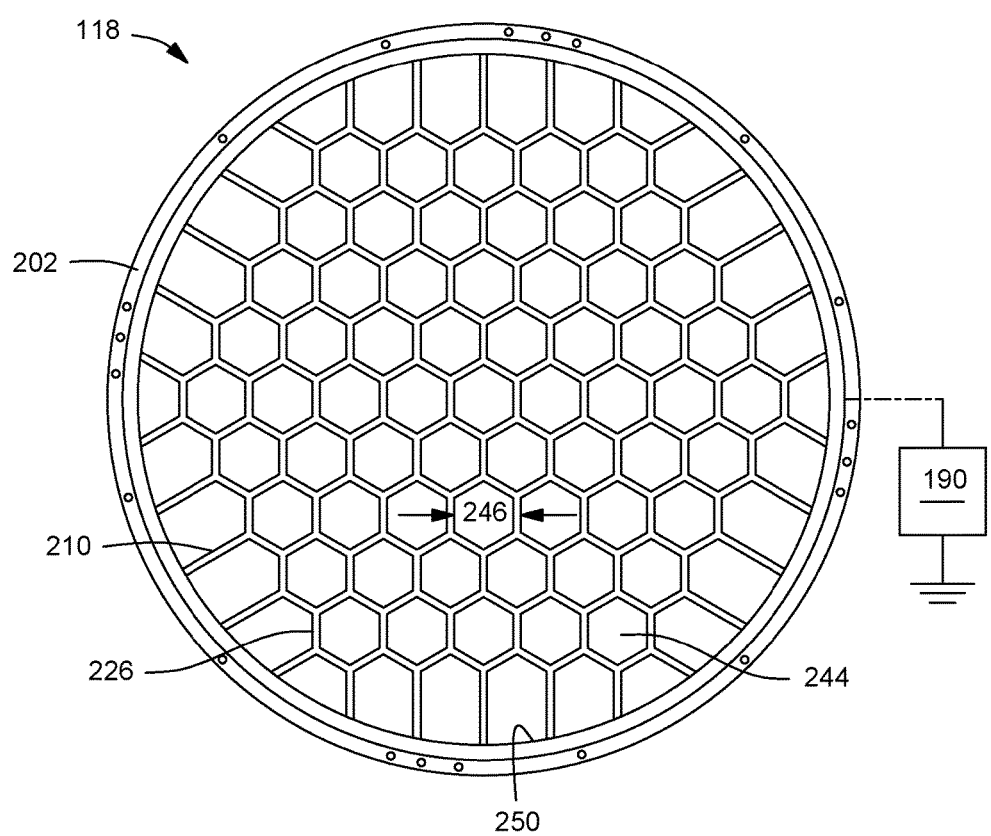
FIG. 2 depicts a top view of a collimator in accordance with some embodiments of the present disclosure.

FIG. 2 depicts a top view of the illustrative collimator 118 coupled to the collimator power source 190 that may be disposed in the deposition chamber 100 of FIG. 1. In some embodiments, the collimator 118 has a generally honeycomb structure having hexagonal walls 226 separating hexagonal apertures 244 in a close-packed arrangement. However, other geometric configurations may also be used. An aspect ratio of the hexagonal apertures 244 may be defined as the depth of the aperture 244 (equal to the length of the collimator) divided by the width 246 of the aperture 244. In some embodiments, the thickness of the walls 226 is about 0.06 inches to about 0.18 inches. In some embodiments, the thickness of the walls 226 is about 0.12 inches to about 0.15 inches. In some embodiments, the collimator 118 is comprised of a material selected from aluminum, copper, and stainless steel.

The honeycomb structure of the collimator 118 may serve as an integrated flux optimizer 210 to optimize the flow path, ion fraction, and ion trajectory behavior of ions passing through the collimator 118. In some embodiments, the hexagonal walls 226 adjacent to a shield portion 202 have a chamfer 250 and a radius. The shield portion 202 of the collimator 118 may assist installing the collimator 118 into the deposition chamber 100.

In some embodiments, the collimator 118 may be machined from a single mass of aluminum. The collimator 118 may optionally be coated or anodized. Alternatively, the collimator 118 may be made from other materials compatible with the processing environment, and may also be comprised of one or more sections. Alternatively, the shield portion 202 and the integrated flux optimizer 210 are formed as separate pieces and coupled together using suitable attachment means, such as welding.

The collimator 118 functions as a filter to trap ions and neutrals that are emitted from the material from the sputtering source 114 at angles exceeding a selected angle, near normal relative to the substrate 101. The collimator 118 may have an aspect ratio change across the width of the collimator 118 to allow a different percentage of ions emitted from a center or a peripheral region of the material from the sputtering source 114 to pass through the collimator 118. As a result, both the number of ions and the angle of arrival of ions deposited onto peripheral regions and center regions of the substrate 101 are adjusted and controlled. In some embodiments, the collimator 118 may have an aspect ratio of about 1:1 to about 1:8. In some embodiments, the aspect ratio of the collimator 118 is constant throughout. In some embodiments, the collimator 118 may be shaped similar to the collimator disclosed in application Ser. No. 14/607,273. Therefore, material may be more uniformly sputter deposited across the surface of the substrate 101. Additionally, material may be more uniformly deposited on the bottom and sidewalls of high aspect ratio features, particularly high aspect ratio vias and trenches located near the periphery of the substrate 101.

As noted above, the inventors have discovered that biasing the collimator 118 with a voltage of about 15 V to about 150 V improves the chances of igniting the plasma at a low power level (e.g., about 100 W to about 3000 W, or about 100 W to about 2000 W) and at low pressures (e.g., about 0.1 to about 50 mTorr). The voltage can be added to the collimator before, simultaneously with, or after the chamber process pressure reaches a predetermined range (e.g., about 0.1 mTorr to about 100 mTorr, depending upon applications). In some embodiments, the voltage has to be on the collimator tens of microseconds before ignition power with complicated waveforms is applied to the target (e.g., sputtering source 114) to breakdown the process gas in the chamber.

Without biasing the collimator 118, the electric field voltage between the sputtering source 114 and the collimator 118 is only equal to the bias voltage applied to the sputtering source 114, which is between about −300 V and about −2,000 V. Biasing the collimator 118 advantageously strengthens the electric field so that the total voltage of the electric field is equal to the magnitude of the target voltage plus the magnitude of the collimator voltage ($|V_{Tar}|+|V_{Col}|$). Furthermore, biasing the collimator 118 creates an electrical field between the collimator 118 and the lower shield 120, which is grounded through the ground adapter 104. As a result, initial breakdown plasma expansion into the volume above and beneath the collimator 118 is advantageously improved. The target voltage is provided by a DC power source capable of outputting 0 to 100 kW with complicated voltage waveforms.

Figure 3:
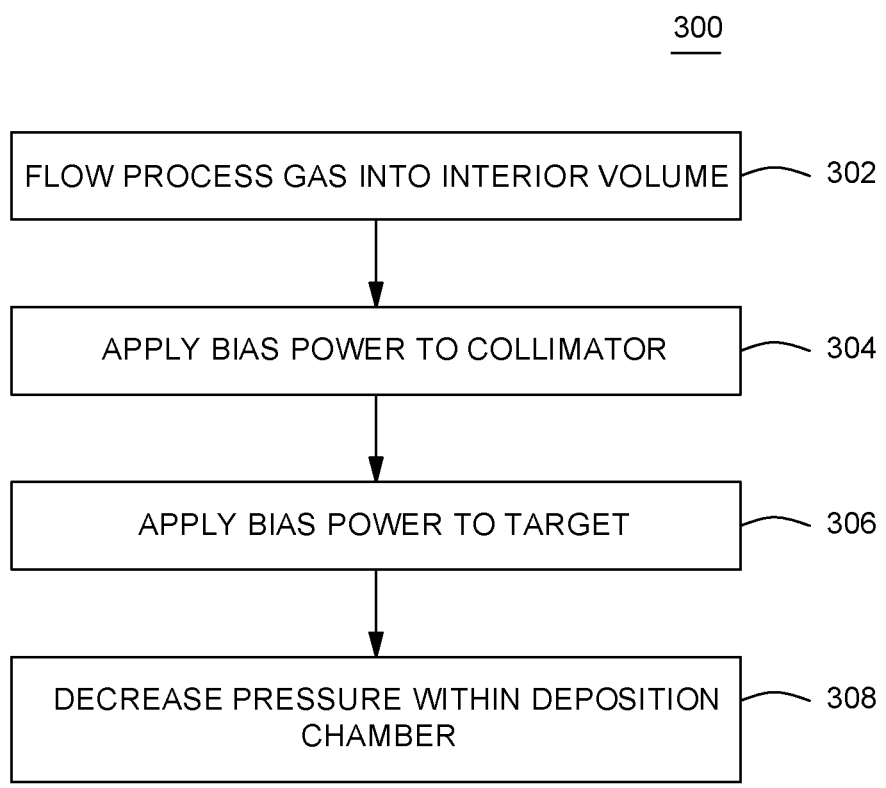
FIG. 3 is a flowchart depicting a method for igniting a plasma in accordance with some embodiments of the present disclosure.

FIG. 3 illustrates a method 300 for igniting a plasma in the deposition chamber 100. Although described herein with respect to FIGS. 1 and 2, other collimator designs and other process chambers having collimators or other similar structure separating the main plasma chamber volume into two parts between the sputtering target and the substrate may also benefit from the plasma ignition techniques disclosed herein.

At 302, a process gas is flowed into the interior volume 106 from the gas source 110 to increase the pressure inside of the deposition chamber 100 to a first pressure. In some embodiments, the pressure is increased to about 0.1 mTorr to about 100 mTorr. In some embodiments, the process gas may be argon (Ar). However, other suitable process gases may be used, such as, for example, helium (He), neon (Ne), nitrogen ($N_2$), oxygen ($O_2$), water ($H_2O$) vapor, or the like.

At 304, DC bias power between about 15 V and about 150 V is applied to the collimator 118 by the collimator power source 190. In some embodiments, the DC bias power may be provided to the collimator 118 prior to the flowing the process gas into the interior volume 106. In some embodiments, 302 and 304 may be performed at the same time.

When the pressure within the deposition chamber 100 reaches equilibrium, bias power of between about −300 V and about −2,000 V is applied to the sputtering source 114 by the power supply 117 at 306. When the electric field between the sputtering source 114 and the collimator 118 is strong enough and the pressure within the deposition chamber 100 is sufficient, plasma ignition is successful. As explained above, because the electric field between the sputtering source 114 and the collimator 118 is stronger due to the biasing of the collimator 118, plasma may advantageously be successfully ignited at a lower gas pressure and lower target power than with a grounded or floating collimator 118. As the plasma stabilizes and expands into the volume beneath the collimator 118, the sputtering source 114 may be powered at a first power (e.g., about 100 W to about 3,000 W, or about 100 W to about 5,000 W) that is lower than a second power applied during processing (e.g., about 5 kW to about 100 kW).

At 308, the pressure within the deposition chamber 100 is decreased. While the pressure is being decreased, the bias power applied to the collimator can be maintained, reduced, or eliminated. After the plasma has been ignited and is stable, the method generally ends and further processing of the substrate may commence. For example, materials can be deposited on the substrate. In some embodiments, e.g., during certain applications, having an electrically floating upper shield 113 may be advantageous to help achieve lower chamber operating pressures. However, as explained above, biasing the collimator 118 (or the floating upper shield 113) advantageously helps to reliably ignite the plasma prior to processing. As such, the switch 199 allows for selectively coupling the upper shield 113 to the collimator power source 190 or to allow the upper shield 113 to be electrically floating.

Thus, embodiments of a method for igniting a plasma have been disclosed herein. The disclosed methods advantageously facilitate more reliable ignition of a plasma using a lower target bias power and lower pressure. The inventors have discovered methods to ignite a plasma without biasing the collimator 118 require 10 or more attempts, whereas the inventive methods can successfully ignite the plasma in 3 or fewer attempts.

While the foregoing is directed to embodiments of the present disclosure, other and further embodiments of the disclosure may be devised without departing from the basic scope thereof.

The invention claimed is:

1. A method for igniting a plasma, comprising:
   flowing a process gas into a process chamber to increase a pressure within the process chamber to a first pressure, wherein the first pressure is approximately 0.1 mTorr to approximately 100 mTorr;
   grounding a lower shield disposed beneath and electrically isolated from a collimator and from an upper shield disposed above the collimator, the lower shield, the upper shield, and the collimator disposed within the process chamber;
   applying a bias voltage from a collimator power source to the collimator such that an electric field is created between the collimator and the lower shield; and
   applying power to a sputtering source disposed in the process chamber above the collimator after the first pressure has been reached and the bias voltage is applied such that an initial breakdown plasma expansion occurs above the collimator between the sputtering source and the collimator and below the collimator between the collimator and the lower shield to ignite the plasma.

2. The method of claim 1, further comprising:
   decreasing the first pressure within the process chamber after plasma ignition.

3. The method of claim 2, further comprising:
   maintaining the bias voltage on the collimator while decreasing the first pressure within the process chamber.

4. The method of claim 1, wherein the power is applied tens of microseconds after the first pressure has been reached and the bias voltage is applied to ignite the plasma.

5. The method of claim 1, wherein the bias voltage is between approximately 15 V and approximately 150 V.

6. The method of claim 1, wherein the power is between approximately 100 W and approximately 5,000 W.

7. The method of claim 1, wherein the power provides a voltage of approximately −300 V and approximately −2,000 V to the target.

8. The method of claim 1, wherein the process gas is flowed into the process chamber before the bias voltage is applied to the collimator.

9. The method of claim 1, wherein the process gas is flowed into the process chamber after the bias voltage is applied to the collimator.

10. The method of claim 1, further comprising:
disconnecting the collimator power source from the collimator after plasma ignition to allow the collimator to be electrically floating.

11. The method of claim 10, further comprising:
depositing materials on a substrate disposed in the process chamber after plasma ignition and while the collimator is electrically floating.

12. The method of claim 1, wherein the process gas comprises one or more of argon (Ar), helium (He), neon (Ne), nitrogen ($N_2$), oxygen ($O_2$), or water ($H_2O$) vapor.

13. A method for igniting a plasma, comprising:
flowing a process gas into a process chamber to increase a pressure within the process chamber to a first pressure of approximately 0.1 mTorr to approximately 100 mTorr;
grounding a lower shield disposed beneath and electrically isolated from a collimator and from an upper shield disposed above the collimator, the lower shield, the upper shield, and the collimator disposed within the process chamber;
applying a bias voltage of approximately 15 V and approximately 150 V from a collimator power source to the collimator such that an electric field is created between the collimator and the lower shield;
applying power to a sputtering source disposed in the process chamber above the collimator after the first pressure has been reached and the bias voltage is applied such that an initial breakdown plasma expansion occurs above the collimator between the sputtering source and the collimator and below the collimator between the collimator and the lower shield to ignite the plasma; and
decreasing the first pressure within the process chamber after plasma ignition.

14. The method of claim 13, wherein the power is applied tens of microseconds after the first pressure has been reached and the bias voltage is applied to ignite the plasma.

15. The method of claim 13, wherein the power is approximately 100 W to approximately 5,000 W.

16. The method of claim 13, wherein the second power provides a voltage of approximately −300 V and approximately −2,000 V to the target.

17. The method of claim 13, further comprising:
disconnecting the collimator power source from the collimator after plasma ignition to allow the collimator to be electrically floating.

18. A method for igniting a plasma, comprising:
flowing a process gas into a process chamber to increase a pressure within the process chamber to a first pressure of approximately 0.1 mTorr to approximately 100 mTorr;
grounding a lower shield disposed beneath and electrically isolated from a collimator and from an upper shield disposed above the collimator, the lower shield, the upper shield, and the collimator disposed within the process chamber;
applying a bias voltage of approximately 15 V and approximately 150 V from a collimator power source to the collimator such that an electric field is created between the collimator and the lower shield;
applying power of approximately 100 W to approximately 5,000 W to a sputtering source disposed in the process chamber above the collimator after the first pressure has been reached and the bias voltage is applied such that an initial breakdown plasma expansion occurs above the collimator between the sputtering source and the collimator and below the collimator between the collimator and the lower shield to ignite the plasma, wherein the power provides a voltage of approximately −300 V and approximately −2,000 V to the target; and
decreasing the first pressure within the process chamber after plasma ignition.

19. The method of claim 18, further comprising:
disconnecting the collimator power source from the collimator after plasma ignition to allow the collimator to be electrically floating.

* * * * *